US011451763B2

(12) United States Patent
Haas et al.

(10) Patent No.: US 11,451,763 B2
(45) Date of Patent: *Sep. 20, 2022

(54) DIRECTIONAL PIXEL ARRAY FOR MULTIPLE VIEW DISPLAY

(71) Applicant: Avalon Holographics Inc., St. John's (CA)

(72) Inventors: Wally Haas, St. John's (CA); Jennifer Campbell-Correa, St. John's (CA); Matthew Hamilton, St. John's (CA); Stephen Hill, St. John's (CA); Jordan Peckham, Portugal Cove-St. Philip's (CA); Chuck Rumbolt, St. John's (CA)

(73) Assignee: Avalon Holographies Inc., St. John's (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/245,637

(22) Filed: Apr. 30, 2021

(65) Prior Publication Data
US 2021/0266521 A1 Aug. 26, 2021

Related U.S. Application Data

(63) Continuation of application No. 16/686,677, filed on Nov. 18, 2019, now Pat. No. 11,025,895, which is a
(Continued)

(51) Int. Cl.
*H04N 13/351* (2018.01)
*H01L 51/52* (2006.01)
(Continued)

(52) U.S. Cl.
CPC ........... *H04N 13/351* (2018.05); *G02B 26/08* (2013.01); *G02B 30/33* (2020.01);
(Continued)

(58) Field of Classification Search
CPC .... H04N 13/351; H04N 13/32; H04N 13/363; H04N 13/398; H04N 13/324;
(Continued)

(56) References Cited

U.S. PATENT DOCUMENTS 8,573,784 B2  11/2013  Yeh et al.
9,093,819 B2 *  7/2015  Fattal ................... H01S 5/18363
(Continued)

FOREIGN PATENT DOCUMENTS

CN         203930226 U        11/2014

*Primary Examiner* — Ibrahim A Khan

(57) ABSTRACT

The present disclosure relates to a directional pixel for a high-angular resolution, wide field of view, multiple view display. The design teaches a directional pixel comprising a substrate, one or more pixel driving circuits, one or more nano- or micro-scale subpixels, and one or more directional optical guiding surfaces, wherein each of said one or more subpixels is comprised of a light emitting device emitting a light beam and an optical microcavity housing said light emitting device. The optical microcavity is comprised of a plurality of reflective surfaces to specifically manipulate and tune said light beam, wherein one or more of said reflective surfaces is a light propagating reflective surface which propagates said light beam out of said microcavity, and said light propagating reflective surface is connected to said one or more directional optical guiding surfaces to direct said light beam at a specific angle. A high-angular resolution, multiple-view light-field display is created by deploying a plurality of directional pixels into a directional pixel array system.

17 Claims, 7 Drawing Sheets

Related U.S. Application Data continuation of application No. 16/355,568, filed on Mar. 15, 2019, now Pat. No. 10,536,688, which is a continuation of application No. 15/446,194, filed on Mar. 1, 2017, now Pat. No. 10,244,230.

(51) Int. Cl.

| | | |
|---|---|---|
| *H04N 13/32* | (2018.01) | |
| *H04N 13/363* | (2018.01) | |
| *H04N 13/398* | (2018.01) | |
| *G02B 26/08* | (2006.01) | |
| *G02B 30/33* | (2020.01) | |
| *H01L 27/32* | (2006.01) | |
| *G02B 5/18* | (2006.01) | |
| *H04N 13/324* | (2018.01) | |

(52) U.S. Cl.
CPC ...... *H01L 27/3211* (2013.01); *H01L 27/3244* (2013.01); *H01L 51/5265* (2013.01); *H04N 13/32* (2018.05); *H04N 13/363* (2018.05); *H04N 13/398* (2018.05); *G02B 2005/1804* (2013.01); *H04N 13/324* (2018.05); *H04N 2213/001* (2013.01)

(58) Field of Classification Search
CPC ....... H04N 2213/001; H04N 2201/001; G02B 26/08; G02B 30/33; G02B 2005/1804; H01L 27/3211; H01L 27/3244; H01L 51/5265

See application file for complete search history.

(56) References Cited

U.S. PATENT DOCUMENTS

| | | | | |
|---|---|---|---|---|
| 9,417,454 | B2* | 8/2016 | Johnson | H04N 13/305 |
| 10,312,224 | B2* | 6/2019 | Edmond | H01L 33/60 |
| 10,340,480 | B1* | 7/2019 | Peckham | H01L 51/5265 |
| 10,395,589 | B1* | 8/2019 | Vahid Far | G09G 3/3208 |
| 10,578,882 | B2* | 3/2020 | El-Ghoroury | G02B 30/50 |
| 10,804,330 | B2* | 10/2020 | Yang | H01L 51/5256 |
| 2001/0045565 | A1* | 11/2001 | Yamazaki | H01L 51/5016 |
| | | | | 428/917 |
| 2004/0130516 | A1* | 7/2004 | Nathan | H01L 27/3272 |
| | | | | 345/82 |
| 2005/0195874 | A1* | 9/2005 | Forrest | H01S 5/026 |
| | | | | 372/39 |
| 2006/0175961 | A1* | 8/2006 | Choong | H01L 51/5275 |
| | | | | 313/506 |
| 2006/0223211 | A1* | 10/2006 | Mishra | G02B 6/1225 |
| | | | | 257/E21.132 |
| 2007/0177388 | A1* | 8/2007 | Wang | H01L 51/5265 |
| | | | | 362/342 |
| 2010/0149073 | A1* | 6/2010 | Chaum | G02B 27/017 |
| | | | | 345/8 |
| 2010/0156863 | A1* | 6/2010 | Brown | H04N 9/3161 |
| | | | | 345/207 |
| 2010/0200869 | A1* | 8/2010 | Sekiya | H01L 27/3248 |
| | | | | 257/E51.018 |
| 2010/0317132 | A1* | 12/2010 | Rogers | H01L 21/6835 |
| | | | | 257/E33.059 |
| 2010/0321640 | A1* | 12/2010 | Yeh | G03B 21/005 |
| | | | | 353/31 |
| 2011/0102560 | A1* | 5/2011 | Kim | G02B 30/24 |
| | | | | 359/463 |
| 2011/0175936 | A1* | 7/2011 | Smith | G09G 3/20 |
| | | | | 359/464 |
| 2011/0205251 | A1* | 8/2011 | Auld | H04N 13/337 |
| | | | | 345/208 |
| 2011/0299044 | A1* | 12/2011 | Yeh | H04N 9/315 |
| | | | | 353/52 |
| 2012/0050694 | A1* | 3/2012 | Huang | H01L 27/156 |
| | | | | 353/38 |
| 2012/0249730 | A1* | 10/2012 | Lee | G06T 7/11 |
| | | | | 348/E13.015 |
| 2012/0268809 | A1* | 10/2012 | Guo | G02B 5/201 |
| | | | | 359/359 |
| 2013/0154498 | A1* | 6/2013 | Missbach | G09G 3/325 |
| | | | | 315/210 |
| 2013/0285537 | A1* | 10/2013 | Chaji | H01L 27/3218 |
| | | | | 445/24 |
| 2014/0063611 | A1* | 3/2014 | Raymond | G06F 3/12 |
| | | | | 359/619 |
| 2014/0268867 | A1* | 9/2014 | Fiorentino | G02B 6/0031 |
| | | | | 362/609 |
| 2014/0300947 | A1* | 10/2014 | Fattal | G02B 26/0808 |
| | | | | 359/298 |
| 2015/0042702 | A1* | 2/2015 | Jiang | B42D 25/328 |
| | | | | 345/694 |
| 2015/0117817 | A1 | 4/2015 | Chen et al. | |
| 2015/0212688 | A1* | 7/2015 | Mcmillan | G06F 3/04883 |
| | | | | 715/850 |
| 2015/0255012 | A1* | 9/2015 | Gu | H01L 51/5221 |
| | | | | 345/83 |
| 2015/0347887 | A1* | 12/2015 | Vosoogh-Grayli | |
| | | | | G06K 19/06084 |
| | | | | 235/494 |
| 2016/0139402 | A1* | 5/2016 | Lapstun | G02B 6/34 |
| | | | | 349/193 |
| 2016/0197306 | A1* | 7/2016 | Oskool | H01L 21/76817 |
| | | | | 257/40 |
| 2016/0212417 | A1* | 7/2016 | Ng | H04N 13/327 |
| 2016/0306390 | A1* | 10/2016 | Vertegaal | G06F 1/1643 |
| 2016/0320615 | A1* | 11/2016 | Nakamura | G02B 27/0961 |
| 2016/0365392 | A1* | 12/2016 | Li | H01L 27/322 |
| 2017/0023711 | A1* | 1/2017 | Jiang | G02B 5/1842 |
| 2017/0048592 | A1* | 2/2017 | Branch | H04W 4/70 |
| 2017/0132976 | A1* | 5/2017 | Yang | G09G 3/3258 |
| 2017/0155891 | A1* | 6/2017 | Hu | G02B 30/29 |
| 2017/0163946 | A1* | 6/2017 | Komanduri | F21V 13/08 |
| 2017/0184776 | A1* | 6/2017 | El-Ghoroury | G02B 27/0018 |
| 2017/0363794 | A1* | 12/2017 | Wan | G02B 30/33 |
| 2017/0371090 | A1* | 12/2017 | Fattal | H04N 13/302 |
| 2018/0172893 | A1* | 6/2018 | Fattal | G02B 6/0035 |
| 2018/0188441 | A1* | 7/2018 | Fattal | G02B 6/0038 |
| 2018/0188691 | A1* | 7/2018 | Fattal | G02B 6/12 |
| 2018/0196194 | A1* | 7/2018 | Fattal | G02B 6/0058 |
| 2018/0203231 | A1* | 7/2018 | Glik | G02B 27/0081 |
| 2018/0240851 | A1* | 8/2018 | Liu | H01L 51/5072 |
| 2018/0241005 | A1* | 8/2018 | Kim | H01L 51/5218 |

* cited by examiner (PRIOR ART, TOP-DOWN VIEW)

(TOP-DOWN VIEW)

(SIDE VIEW)

ID_PIXEL ARRAY FOR
MULTIPLE VIEW DISPLAY

CLAIM OF PRIORITY

This patent application is a continuation of and claims the benefit of U.S. Non-Provisional application Ser. No. 16/686,677 filed on 18 Nov. 2019 for which a notice of allowance was issued on 3 Feb. 2021, which is a continuation of U.S. Non-Provisional application Ser. No. 16/355,568, filed Mar. 15, 2019, now U.S. Pat. No. 10,536,688, which is a continuation of U.S. Non-Provisional application Ser. No. 15/446,194, filed Mar. 1, 2017, now U.S. Pat. No. 10,244,230, each of which is hereby expressly incorporated by reference herein in its entirety.

BACKGROUND OF THE INVENTION

Field of the Invention

The present disclosure relates to a directional pixel design for the creation of a high angular resolution, wide field of view, multiple view display.

Background of the Invention

Despite the large amount of light-field display research and development, no commercial multiple-view, autostereoscopic, high-angular resolution, wide field of view light-field display exists. Current commercial displays use pixels sized in the range of tens to hundreds of microns. When producing a light-field display meant to replicate a natural, "real life" image, the resolution of current displays is too low. Current displays also produce a narrow field of view due to limitations on the output angle using conventional lenses over display screens (such as described in U.S. Pat. Nos. 9,274,345 and 9,250,446) or image projectors (such as described in U.S. Pat. No. 8,567,960). In addition to resolution and field of view limitations, traditional three-dimensional displays commonly create an accommodation-convergence conflict, resulting in discomfort for the viewer.

U.S. Pat. No. 8,928,969 teaches a lens covering a plurality of subpixels, whereby the subpixels cannot be individually addressed.

The use of a directional light modulator that is mechanically tilted or angularly articulated to direct light beams to different angles, such as in U.S. Pat. No. 9,195,053 is previously known. Also known is a directional backlight for controlling and scattering light beams, such as in U.S. Pat. No. 9,459,461.

U.S. Pat. No. 7,829,902 teaches pixels constructed with the circuitry located at the periphery of the light emitting portion of the pixel, thereby limiting the space of light emission surface; the vertical waveguides cannot successfully scale down to collimate smaller-scale, such as nanoscale, pixels.

U.S. Pat. No. 9,389,415 teaches the use of periodic gratings to direct light beams connected in a medium at a specific angle; while these periodic gratings provide wide angles for traditional pixel sizes, they cannot successfully direct light emitted from smaller-scale pixels. The periodic gratings of U.S. Pat. No. 9,389,415 also limit the display to horizontal parallax.

U.S. Pat. No. 9,372,349 describes a light-field display deploying a collimated backlight. There remains a need for a light-field display with reduced spectral bandwidth of each subpixel to allow for accurate beam steering, in particular for small scale pixel sizes.

SUMMARY OF THE INVENTION

It is an object of the present disclosure to improve directional pixel design for the creation of a high angular resolution, wide field of view, multiple view display.

Pixels previously known in the art generally control output colour and intensity while broadcasting the light in all directions. It is an object of the present disclosure to provide a directional pixel that controls the light beam's colour, intensity, and direction.

Instances of directional pixels previously known in the art provide a limited number of distinct light emission directions, creating displays with limited angular resolution and limited depth of field. It is an object of the present disclosure to provide an increased number of distinct light emission directions, creating high angular resolution displays with improved depth of field.

It is an object of the present disclosure to collimate, manipulate, or tune light beams for small scale pixel sizes within an optical microcavity before the light beams propagate through the system; this reduces the spectral bandwidth of the output light beams, maximizing control of the output angle.

It is an object of the invention to provide small scale (nano- or micro-scale) pixels. When used in a display, the reduced pixel size allows the system to output a greater number of light beams in a greater number of distinct directions; this improves upon pixels previously known in the art by allowing the generation of higher angular resolution displays with improved effective resolution of multi-dimensional objects. The increased number of light-field display views allows a viewer located at any viewing position to simultaneously receive multiple views; this is known as a super multi-view (SMV) display. An SMV display, providing improved angular resolution, eliminates the accommodation-convergence conflict and produces displays with a higher quality depth of field.

In one aspect there is provided a directional pixel comprising a substrate, one or more pixel driving circuits, one or more nano- or micro-scale subpixels, and one or more directional optical guiding surfaces, wherein each of said subpixels is comprised of: a light emitting device emitting a light beam and an optical microcavity housing said light emitting device, said optical microcavity comprised of a plurality of reflective surfaces to substantially collimate, manipulate, or tune said light beam, wherein one or more of said reflective surfaces is a light propagating reflective surface which propagates said light beam out of said microcavity, and said light propagating reflective surface is connected to said directional optical guiding surface to direct said light beam at a specific angle.

In another aspect there is provided a method for creating a high-angular resolution, multiple-view light-field display, comprising the step of deploying a plurality of directional pixels into a directional pixel array system, one or more of said directional pixels comprising: a substrate; one or more pixel driving circuits; one or more nano- or micro-scale subpixels; and one or more directional optical guiding surfaces; wherein each of said subpixels is comprised of a light emitting device emitting a light beam and an optical microcavity housing said light emitting device, said optical microcavity comprised of a plurality of reflective surfaces to substantially collimate, manipulate, or tune said light beam, and one or more of said reflective surfaces is a light propagating reflective surface which propagates said light beam out of said microcavity, whereby said light propagating reflective surface is connected to said directional optical guiding surface to direct said light beam at a specific angle.

DETAILED DESCRIPTION OF THE INVENTION

Figure 1:
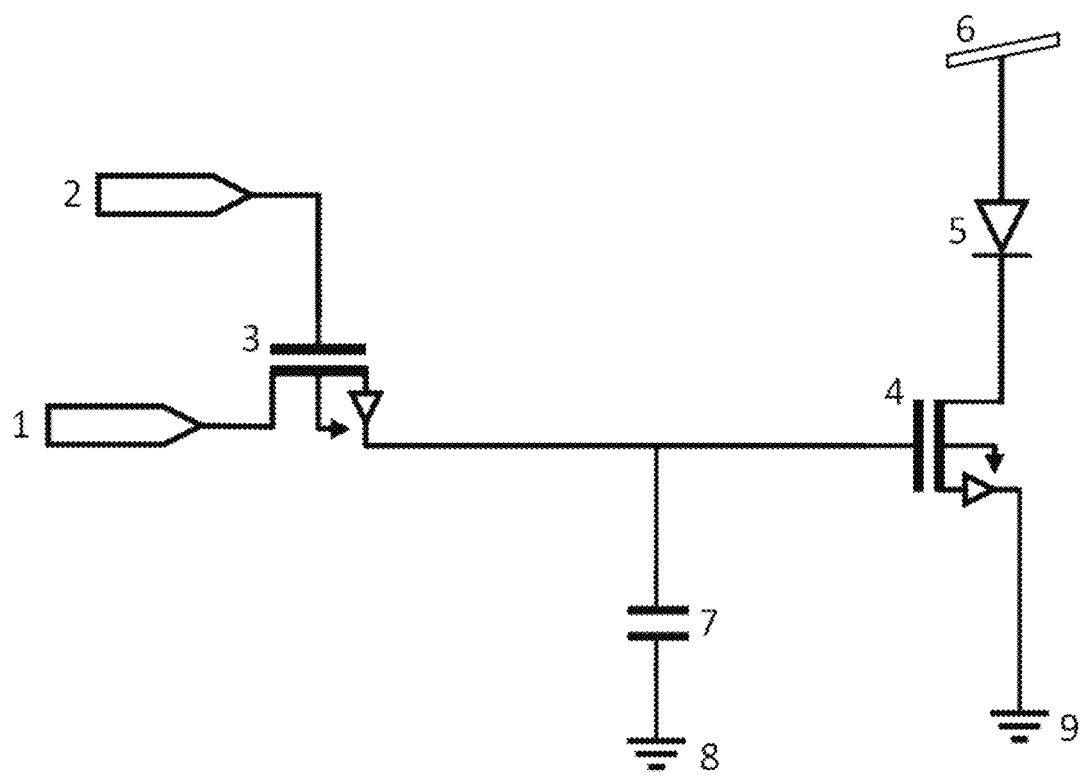
FIG. 1 illustrates a 2T1C pixel driver circuit.

Various features of the invention will become apparent from the following detailed description taken together with the illustrations in the Figures. The design factors, construction and use of the directional pixel disclosed herein are described with reference to various examples representing embodiments which are not intended to limit the scope of the invention as described and claimed herein. The skilled technician in the field to which the invention pertains will appreciate that there may be other variations, examples and embodiments of the invention not disclosed herein that may be practiced according to the teachings of the present disclosure without departing from the scope and spirit of the invention.

Definitions

Unless defined otherwise, all technical and scientific terms used herein have the same meaning as commonly understood by one of ordinary skill in the art to which this invention pertains.

The use of the word "a" or "an" when used herein in conjunction with the term "comprising" may mean "one," but it is also consistent with the meaning of "one or more," "at least one" and "one or more than one."

As used herein, the terms "comprising," "having," "including" and "containing," and grammatical variations thereof, are inclusive or open-ended and do not exclude additional, unrecited elements and/or method steps. The term "consisting essentially of" when used herein in connection with a composition, device, article, system, use or method, denotes that additional elements and/or method steps may be present, but that these additions do not materially affect the manner in which the recited composition, device, article, system, method or use functions. The term "consisting of" when used herein in connection with a composition, device, article, system, use or method, excludes the presence of additional elements and/or method steps. A composition, device, article, system, use or method described herein as comprising certain elements and/or steps may also, in certain embodiments consist essentially of those elements and/or steps, and in other embodiments consist of those elements and/or steps, whether or not these embodiments are specifically referred to.

As used herein, the term "about" refers to an approximately +/−10% variation from a given value. It is to be understood that such a variation is always included in any given value provided herein, whether or not it is specifically referred to.

The recitation of ranges herein is intended to convey both the ranges and individual values falling within the ranges, to the same place value as the numerals used to denote the range, unless otherwise indicated herein.

The use of any examples or exemplary language, e.g. "such as", "exemplary embodiment", "illustrative embodiment" and "for example" is intended to illustrate or denote aspects, embodiments, variations, elements or features relating to the invention and not intended to limit the scope of the invention.

As used herein, the terms "connect" and "connected" refer to any direct or indirect physical association between elements or features of the directional pixel or subpixel of the present disclosure. Accordingly, these terms may be understood to denote elements or features that are partly or completely contained within one another, attached, coupled, disposed on, joined together, etc., even if there are other elements or features intervening between the elements or features described as being connected.

As used herein, the term "pixel" refers to a light source and light emission mechanism used to create a display.

It is contemplated that any embodiment of the compositions, devices, articles, methods and uses disclosed herein can be implemented by one skilled in the art, as is, or by making such variations or equivalents without departing from the scope and spirit of the invention.

Subpixel

The present disclosure provides individually addressable red, green, and blue (RGB) subpixels. The subpixel size is reduced to a range from the nanoscale to several microns, significantly smaller than the pixel size previously known in the art. A subpixel is comprised of a light emitting device housed within an optical microcavity. The optical microcavity is comprised of a plurality of reflective surfaces to substantially collimate, manipulate or tune the light. At least one of the reflective surfaces is a light propagating reflective surface connected to the optical microcavity to propagate the light out of the microcavity.

Directional Pixel

A pixel as previously known in the art broadcasts light in all directions. The present disclosure provides an improved pixel, the directional pixel, which directs a light beam to a single direction, or at a single angle. Each directional pixel is assigned a specific direction, or x and y coordinates; the field of view can be up to 180 degrees for both x and y coordinates.

Each directional pixel is comprised of one or more pixel driver circuits, one or more subpixels, and one or more directional optical guiding surfaces. The subpixels are RGB subpixels, which can include red, green, or blue subpixels. A plurality of directional pixels, propagating light in a plurality of directions, forms a directional pixel array. The directional pixel array sends an array of directional light beams to different viewing angles. For example, in a 512× 512 directional pixel array, as each directional pixel directs light at differing angles, each directional pixel array produces a light-field display with 512×512 samples of the viewing angle function and an infinite number of different viewing angles. Where a first viewer located at a first angle can view a first directional pixel directed towards the first viewer, a second viewer at a second angle can view a second directional pixel directed towards the second viewer. While both viewers appear to be gazing at the same point in space, they actually view different images, which may vary in brightness, intensity, or colour. When a plurality of directional pixels are used in a display they operatively form a full three-dimensional light-field display with full motion parallax.

The pixel driver circuit controls the subpixel and drives different voltages to the light emitting devices to achieve different colours and intensities. In an array of subpixels, an array of pixel driver circuits operatively connected to each subpixel sits behind each subpixel in the array; likewise in an array of directional pixels, the pixel driver circuits connected to the subpixels sit behind each subpixel in the directional pixel array.

In the illustrative embodiments, the pixel driver circuit is a sample and hold circuit. Each directional pixel in an array is updated sequentially, as each circuit in the array of pixel driver circuits drives the data to its associated subpixel, and samples and holds the data; each subpixel holds its value until new data is available to update it.

In the illustrative embodiments, the microcavity cathode (bottom reflective surface) is comprised of a conducting material. The thickness of the cathode is set to increase reflectivity and reduce unwanted phase changes. The microcavity light propagating reflective surface (upper reflective surface) has dielectric layers comprised of titanium dioxide and silicon dioxide. The light propagating reflective surface is highly reflective, allowing only a small portion of the light to escape, and the light propagating reflective surface advantageously has no absorption due to its dielectric composition. The reflectance of the light propagating reflective surface can be tuned by increasing the number of dielectric pairs. Each of the dielectric layers has an optical path length of $\lambda/4$. The optical path length of the dielectric layers differs from the thickness of the dielectric layers because the path length accounts for the distance the light travels within the optical cavity. Because the optical path of the dielectric layers is a mode of the predetermined wavelength, the light propagating reflective surface is a highly reflective mirror for both the specified wavelength and a range of wavelengths surrounding the center wavelength. When the light emitting device emits light, the light beams reflect between the two mirrors. With constructive interference at the center peak and destructive interference surrounding the center peak, the light rays perpendicular to the mirrors are emitted from the light propagating reflective surface, thereby creating substantially collimated, manipulated, or tuned light with a reduced spectral bandwidth.

In the present disclosure, each directional pixel emits light in a single direction; the pixels do not broadcast light in all directions as generally known in the art. To create a three-dimensional light-field display, each of the light beams propagate through one or more directional optical guiding surfaces; the directional optical guiding surface directs the light in a single direction. The directional optical guiding surface can be any type of dielectric surface, such as a lens, lens-like surface, or a metasurface with periodic or non-periodic gratings. Multiple viewers can observe the same three-dimensional display screen and be presented with differing light beams, directed by the directional optical guiding surface. For example, where a first viewer located at a first angle can view a first directional pixel directed towards the first viewer, a second viewer at a second angle can view a second directional pixel directed towards the second viewer. The directional optical guiding surface guides the light beams emitted from each of the RGB subpixels in a first directional pixel in the same direction as the RGB subpixels in a second directional pixel, and so forth.

The skilled technician in the field to which the invention pertains will appreciate that there are multiple types of dielectric surfaces that can successfully act as the directional optical guiding surface. The directional optical guiding surface can be, but is not limited to, one or more lenses, one or more lens-like surfaces, or one or more metasurfaces. The directional optical guiding surface can be, but does not have to be, etched with periodic or non-periodic gratings or structures. The directional optical guiding surface can be a single surface or a plurality of surfaces operatively connected together.

Illustrative Embodiments of the Invention

In an illustrative embodiment of the invention, the invention is comprised of a pixel driver circuit comprised of a thin film transistor (TFT) backplane; an organic light-emitting diode (OLED) as the light emitting device; an optical microcavity comprised of a plurality of reflective surfaces housing said OLED; and a directional optical guiding surface. The pixel driver circuit provides power to the OLED, the microcavity significantly reduces the output angle of the light emitted from the OLED, creating substantially collimated, manipulated, or tuned light, and the directional optical guiding surface directs the light beam in a single direction, or at a single angle.

FIG. 1 illustrates a 2 transistor 1 capacitor (2T1C) pixel driver circuit. A plurality of circuits form an array and the edges of the array have connections coming out in a grid-like connection structure; the data connections are the array columns and the sample connections are the array rows. As shown in FIG. 1, each individual circuit has a data line (1) and a scan line (2). When scan line (2) is active, the data is sampled and the sample signal is sent to a switching transistor (TFT1) (3) at the side edge of the array. When a subpixel is selected, TFT1 (3) sends the voltage signal to the data line transistor (TFT2) (4); the TFT2 (4) drives a light-emitting device (in the illustrative embodiments, an OLED (5)). A voltage rail (6) supplies power to TFT2 (4). When a plurality of circuits form an array, and the first row of the array is active, TFT1 (3) samples each directional pixel, actively sampling and updating the full row. When each subpixel is sampled, a capacitor (7) holds the data to ensure the OLED (5) state remains constant until the directional pixel is refreshed. Once the first row is complete, each of the plurality of capacitors holds the data for the first row while a second row of the array is active and follows the same procedure. The capacitors hold the data for the second row while a third row of the array is active, and so on. This procedure iterates row by row, returning to the first row of the array when the last row is sampled. The circuit has two ground wires (8, 9). The data line (1) and scan line (2) controlling TFT1 (3) individually connect to the pixel array, allowing each of the subpixels to be individually addressable.

In the illustrative embodiments, each TFT is a staggered bottom gate device with a dielectric and an n-type semiconductor. The TFTs also include metallic source, drain and gate electrodes, and a passivation layer back channel. Fabricating the pixel backplane with TFTs allows the three-dimensional pixel array display to be scaled up to a traditional electronic display size. In the illustrative embodiment, the nanoscale TFTs are fabricated through electron beam lithography (EBL).

The present disclosure teaches micron-sized directional pixels and subpixels ranging from the nanoscale up to and including 10 1 microns in size; to fit a 2T1C pixel driver circuit into a micron-sized area, the circuit is fabricated with two TFTs layered on top of the capacitor. Two vias connect the two TFTs to the two capacitor electrodes. A third via connects the TFTs to an OLED; the OLED is fabricated on top of the two TFTs. Planarizing layers are located between the capacitor and the two TFTs, and between the two TFTs and the OLED. In the illustrative embodiments, OLEDs are used as the light emitting devices because they have improved colour accuracy, increased contrast, and lower power requirements in comparison to current LCD display technology. The present disclosure improves upon prior art by reducing the inter-OLED spacing to tens of nanometers.

Figure 2:
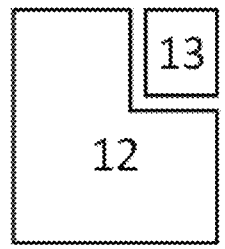
FIG. 2 provides a schematic top-down view of a pixel configuration, as commonly known in the art.
Figure 3A:
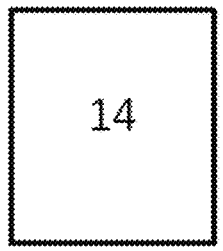
FIG. 3A provides a schematic top-down view of the subpixel configuration of the present disclosure.
Figure 3B:
FIG. 3B provides a schematic side view of the subpixel configuration of the present disclosure.

FIG. 2 shows a top-down view of a pixel as commonly known in the art, wherein the pixel driver circuitry (13) is located upon the same plane as the light emitting portion (12) of the pixel. The illustrative embodiment improves upon prior art by stacking the pixel driver circuit behind the light emitting portion: FIG. 3A shows a top-down view of the present disclosure, where only the light emitting portion (14) is visible; FIG. 3B shows a side view of the present disclosure, illustrating the pixel driver circuitry (15) underneath the light emitting portion (14). This structure saves space on the face of the pixel, such that more area is available for light emission, and allows the overall pixel size to be reduced. A person skilled in the art will appreciate that such a pixel design provides a significant increase in aperture ratio compared to a display previously known in the art. The present disclosure can produce RGB subpixels ranging from the nanoscale up to and including 10 microns in size, a significant size reduction compared to the prior art RGB pixel size of 10 µm to 30 µm. To miniaturize the subpixel size to less than 10 microns, nano- or micro-scale circuitry, in combination with the optical microcavity, reduce the overall pixel footprint.

Figure 4:
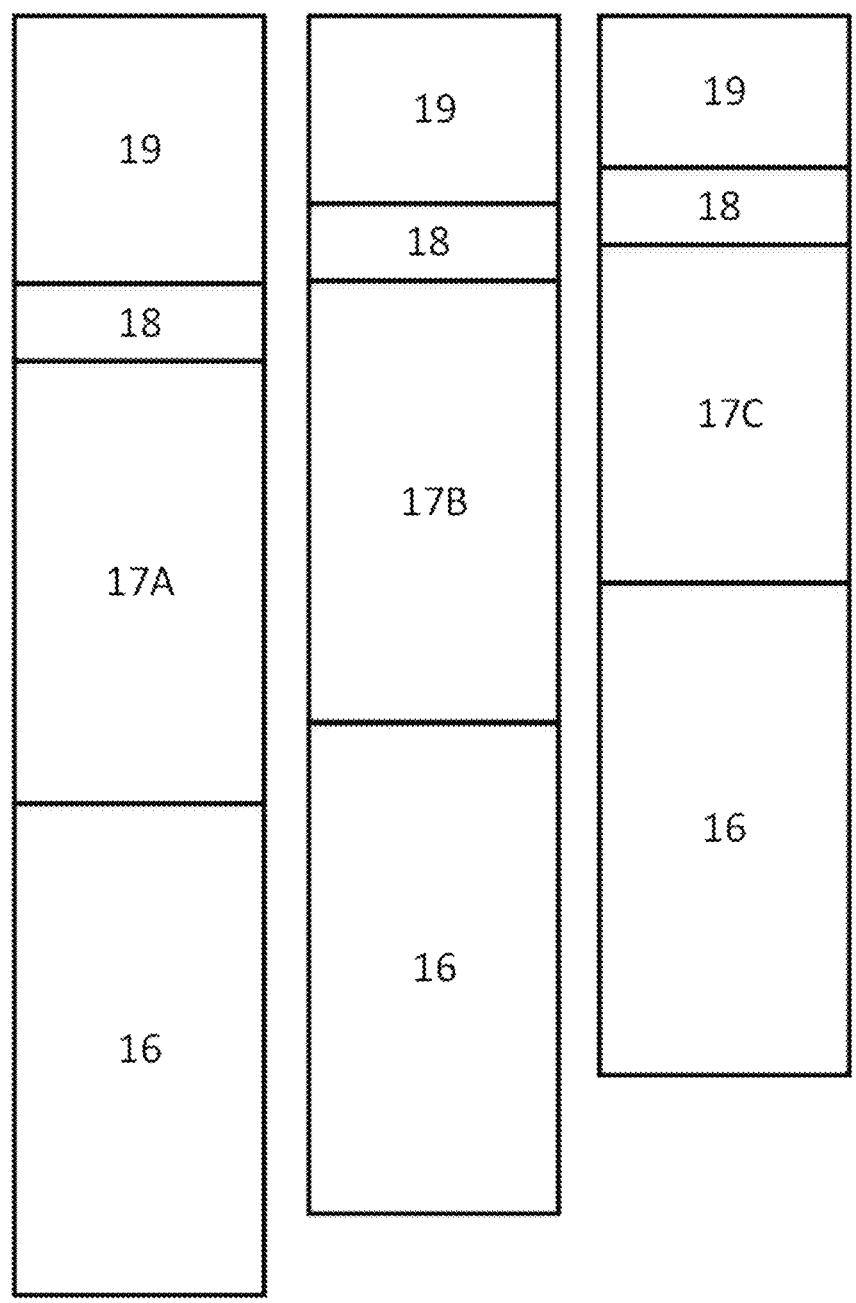
FIG. 4 illustrates the basic subpixel layers of the present disclosure.

The optical microcavity consists of a plurality of reflective surfaces housing an OLED. In the illustrative embodiments the microcavity is comprised of a bottom reflective surface and a top reflective surface, with a multi-layer OLED located between the two reflective surfaces. The microcavity can be constructed with the cathode doubling as a reflective surface. The top reflective surface is also a light propagating reflective surface. FIG. 4 shows the basic layers of the red, green and blue subpixels, wherein each subpixel is comprised of a cathode (16), coloured OLED layers (17A-C), a transparent anode (18), and a filler layer (19), each configured within the optical microcavity. The OLED RGB colours are red (17A), green (17B) and blue (17C). The OLED width, and the distance between the plurality of reflective surfaces, is set at a predetermined length; the OLED optical path length is $\lambda/2$, where $\lambda$ is a predetermined center emission wavelength.

Figure 5:
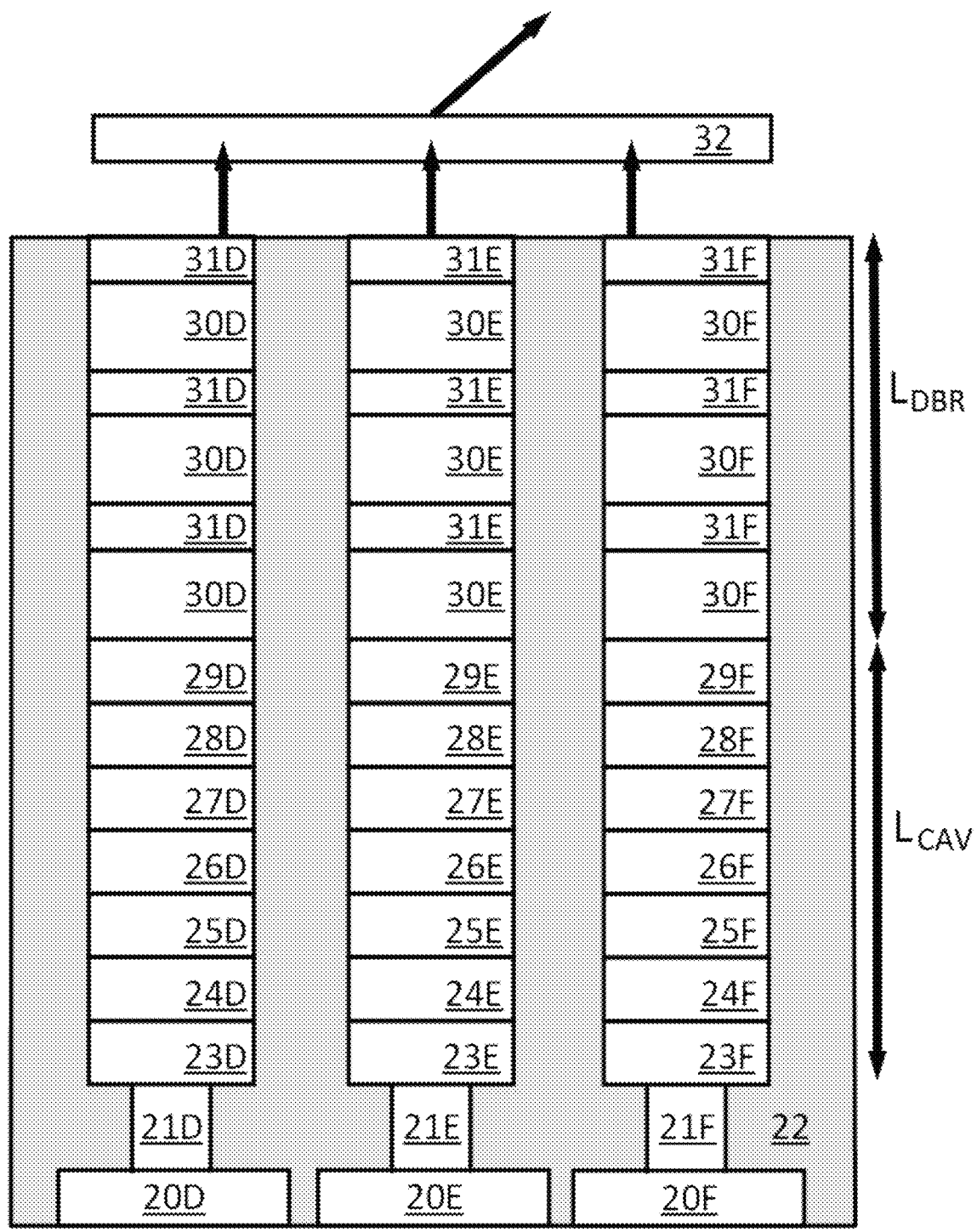
FIG. 5 illustrates a directional pixel configuration of the present disclosure.

FIG. 5 illustrates an illustrative embodiment of the invention. In this embodiment, each subpixel is driven by a single, dedicated pixel driver circuit. For example, FIG. 5 illustrates three separate pixel driving circuits (20) driving three separate subpixels (23-31); in the illustration, like elements are denoted with D, E, and F, and reference to a numerical element of the figure refers to each of the like elements, as they all operate in the same fashion.

As illustrated in FIG. 5, pixel driver circuits (20), such as TFT backplanes, connect to cathodes (23) through vias (21) in a substrate (22). The cathodes double as one of the optical microcavity reflective surfaces. On top of the cathodes are electron transport layers (24), emission layers (25), hole transport layers (26), hole injection layers (27), anodes (28) and fill layers (29); these elements comprise the three OLEDs. On top of the fill layers (29) are distributed Bragg reflectors (DBRs), light propagating reflective surfaces consisting of dielectric layers alternating between low indices of refraction (30) and high indices of refraction (31). The length of the optical microcavities is shown as $L_{CAV}$ and the length of the connected DBRs is shown as $L_{DBR}$. The DBRs emit one or more substantially collimated, manipulated, or tuned light beams, and the light beams propagate through a directional optical guiding surface (32). The directional optical guiding surface directs the light beams at specific spatial wave vectors. Where each pixel uses a dedicated DBR, the DBR is operatively tuned for each output wavelength.

Figure 6:
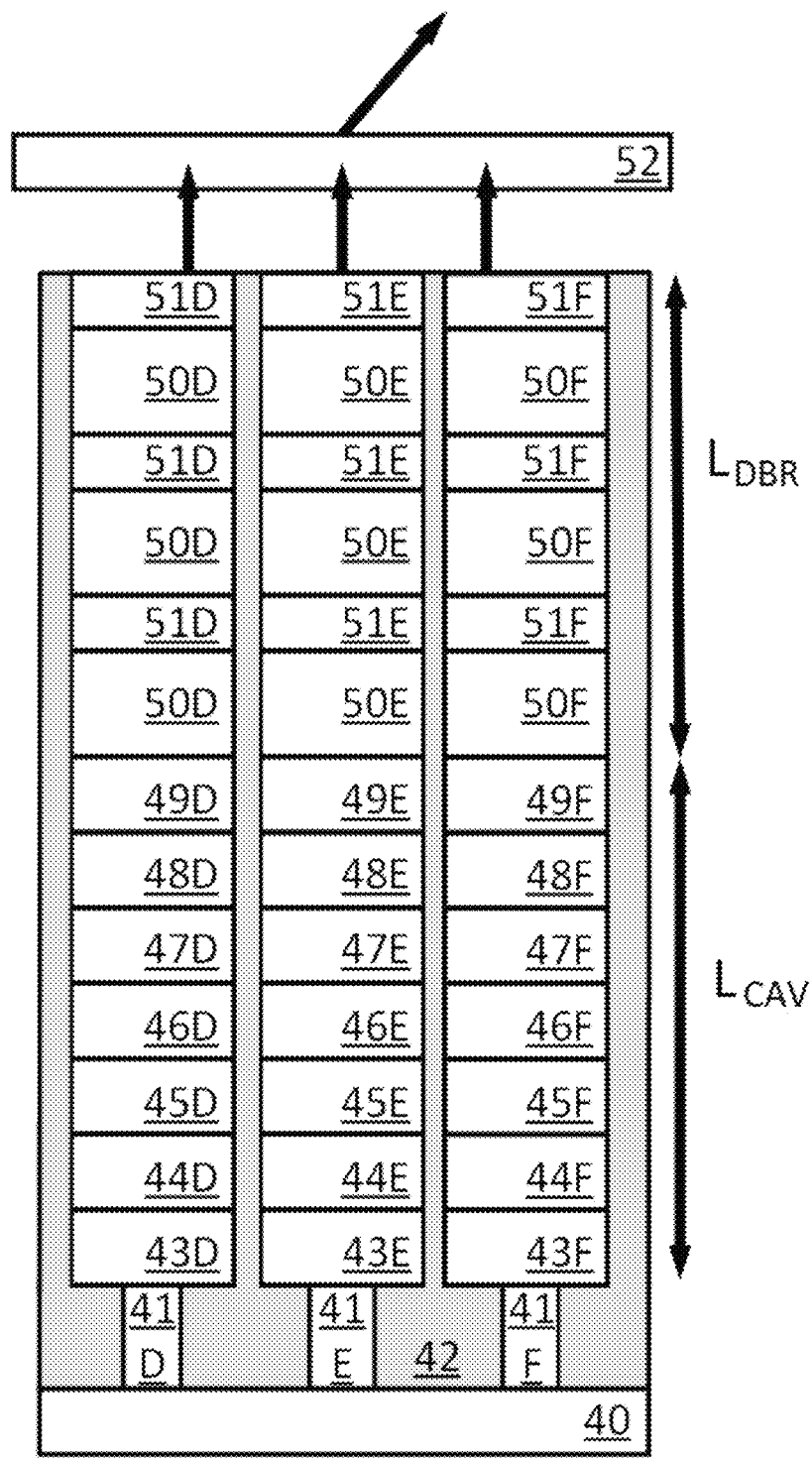
FIG. 6 illustrates an alternate directional pixel configuration of the present disclosure.

FIG. 6 illustrates another embodiment of the present disclosure, where one pixel driving circuit drives a plurality of subpixels. Such a configuration can be used for, but is not limited to, a grayscale display. For example, FIG. 6 illustrates one pixel driving circuit (40) driving three separate subpixels (43-51); in the illustration, like elements are denoted with D, E, and F, and reference to a numerical element of the figure refers to each of the like elements, as they all operate in the same fashion.

As illustrated in FIG. 6, the pixel driving circuit (40) connects to cathodes (43) through vias (41) in a substrate (42). The cathodes double as one of a plurality of reflective surfaces. On top of the cathodes are electron transport layers (44), emission layers (45), hole transport layers (46), hole injection layers (47), anodes (48) and fill layers (49); these elements comprise the three OLEDs. On top of the fill layers (49) are DBRs, consisting of dielectric layers alternating between low indices of refraction (50) and high indices of refraction (51). The length of the optical microcavities is shown as $L_{CAV}$ and the length of the DBRs is shown as $L_{DBR}$. The DBRs emit one or more substantially collimated, manipulated, or tuned light beams, and the light beams propagate through a directional optical guiding surface (52). The directional optical guiding surface directs the light beam at a specific spatial wave vector. Where each pixel uses a dedicated DBR, the DBR is operatively tuned for each output wavelength.

Figure 7:
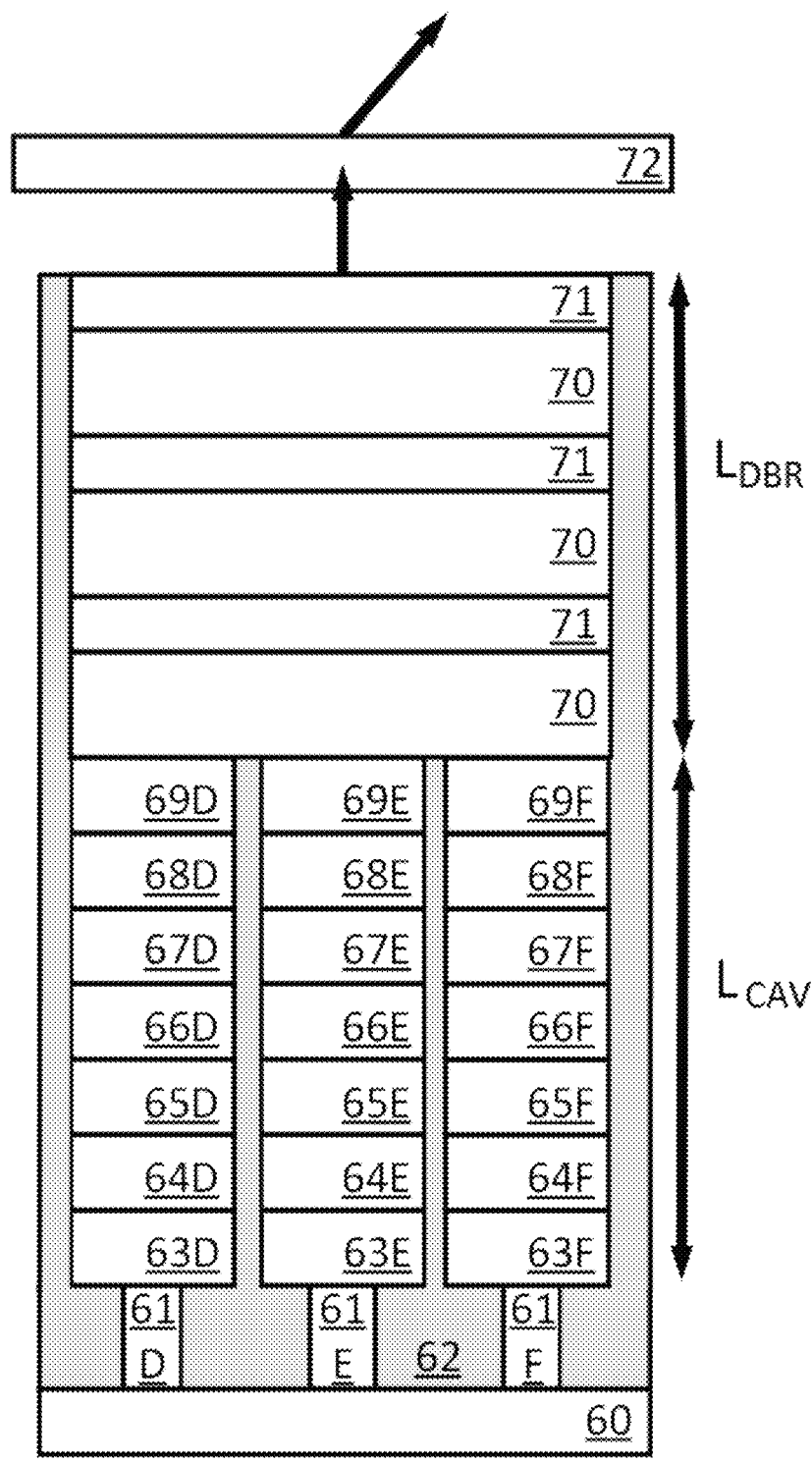
FIG. 7 illustrates an alternate directional pixel configuration of the present disclosure.

FIG. 7 illustrates another embodiment of the present disclosure, where one pixel driving circuit drives a plurality of subpixels, but the subpixels share one or more optical microcavity light propagating reflective surfaces. Such a configuration can be used for, but is not limited to, a grayscale display. For example, FIG. 7 illustrates one pixel driving circuit (60) driving three separate subpixels (63-69) which share a reflective surface (70-71); in the illustration, like elements are denoted with D, E, and F, and reference to a numerical element of the figure refers to each of the like elements, as they all operate in the same fashion.

As illustrated in FIG. 7, the pixel driving circuit (60) connects to cathodes (63) through vias (61) in a substrate (62). The cathodes double as one of a plurality of reflective surfaces. On top of the cathodes are electron transport layers (64), emission layers (65), hole transport layers (66), hole injection layers (67), anodes (68) and fill layers (69); these elements comprise the three OLEDs. On top of the three separate fill layers (69) is a single, shared, DBR, consisting of dielectric layers alternating between low indices of refraction (70) and high indices of refraction (71). The length of the optical microcavities is shown as $L_{CAV}$ and the length of the DBR is shown as $L_{DBR}$. The DBR emits one or more substantially collimated, manipulated, or tuned light beams, and the light beams propagate through a directional optical guiding surface (72). The directional optical guiding surface directs the light beam at a specific spatial wave vector. Where a plurality of pixels share a DBR, the DBR operates as a broadband structure with a reflectance covering the entire spectral range.

Figure 8A:
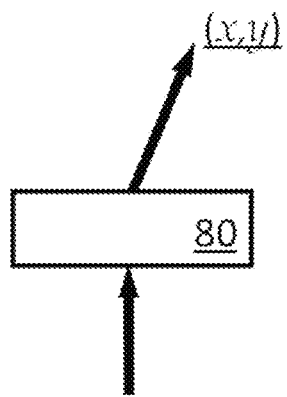
FIG. 8A illustrates the directional optical guiding surface of the present disclosure.
Figure 8B:
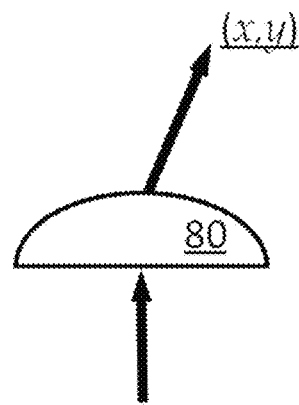
FIG. 8B illustrates the directional optical guiding surface of the present disclosure as a lens or lens-like surface.
Figure 8C:
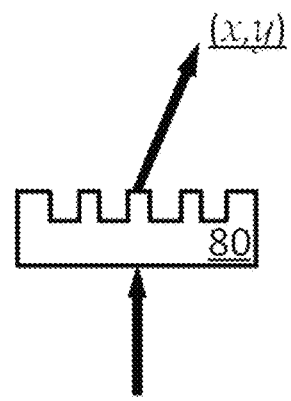
FIG. 8C illustrates the directional optical guiding surface of the present disclosure as a metasurface etched with gratings.

FIGS. 8A through 8C are provided to illustrate the directional optical guiding surface without limiting or departing from the scope and spirit of the invention. As illustrated, a light beam enters the directional optical guiding surface (80), where it is deflected and directed at a specific spatial wave vector with specific x and y coordinates. For exemplary purposes, FIG. 8A depicts a generic directional optical guiding surface (80), FIG. 8B depicts a lens or lens-like structure (80), and FIG. 8C depicts a metasurface etched with gratings or structures (80).

The invention claimed is:

1. A method of operating a directional pixel array comprising:
   sampling data from a data line in a subpixel in the directional pixel array and sending the sampled data to a switching transistor;
   sending a voltage signal to a data line transistor in the subpixel to drive a light-emitting device in the subpixel
   directing a light beam created in the light-emitting device through an optical microcavity comprising OLED layers interposed between a bottom reflective surface and a top light propagating reflective surface, the top light propagating surface reducing the spectral bandwidth of the light beam and propagating the light beam out of the optical microcavity;
   directing the light beam through a directional optical guiding surface connected to the top light propagating reflective surface to direct the light beam at a specific angle to create a light image; and
   holding the sampled data with a capacitor to hold the state of the light-emitting device constant until the subpixel is refreshed.

2. The method of claim 1, wherein each subpixel in the directional pixel array is individually addressable.

3. The method of claim 1, further comprising:
   sampling data from a row of subpixels in the directional pixel array and updating the full row; and
   repeating the sampling for each row in the directional pixel array.

4. The method of claim 1, wherein the light-emitting device is an organic light-emitting device.

5. The method of claim 1, wherein when a light beam enters the directional optical guiding surface from the subpixel the light beam is deflected and directed at a specific spatial wave vector with specific x and y coordinates.

6. The method of claim 1, wherein the directional pixel array produces a three-dimensional light field display.

7. The method of claim 6, wherein the three-dimensional light field display has full motion parallax.

8. The method of claim 1, wherein the light image at different viewing angles varies in brightness, intensity, colour, or a combination thereof.

9. The method of claim 1, wherein the light propagating reflective surface receives and directs said light beam at a specific angle.

10. The method of claim 1, wherein each subpixel in the array is updated sequentially.

11. The method of claim 1, wherein the microcavity reduces the output angle emitted from the light-emitting device creating collimated, manipulated, or tuned light.

12. The method of claim 1, wherein the light beam leaving the directional optical guiding surface can be viewed at a plurality of viewing positions.

13. The method of claim 1, wherein the directional pixel array produces a light-field display with a plurality of viewing angles.

14. The method of claim 1, wherein sending a voltage signal to a data line transistor comprises supplying power to the data line transistor through a voltage rail.

15. The method of claim 1, wherein the bottom reflective surface is a cathode.

16. The method of claim 1, wherein the top light propagating reflective surface is a distributed Bragg reflector.

17. The method of claim 1, wherein the OLED layers comprise, in order from bottom to top, an electron transport layer, an emission layer, a hole transport layer, and a hole injection layer.

* * * * *